United States Patent
Park

(10) Patent No.: US 10,922,222 B2
(45) Date of Patent: Feb. 16, 2021

(54) DATA PROCESSING SYSTEM AND OPERATING METHOD FOR GENERATING PHYSICAL ADDRESS UPDATE HISTORY

(71) Applicant: SK hynix Inc., Gyeonggi-do (KR)

(72) Inventor: Jeen Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 194 days.

(21) Appl. No.: 16/044,946

(22) Filed: Jul. 25, 2018

(65) Prior Publication Data

US 2019/0227923 A1    Jul. 25, 2019

(30) Foreign Application Priority Data

Jan. 19, 2018    (KR) .................. 10-2018-0006841

(51) Int. Cl.
*G06F 12/02*    (2006.01)
*G11C 16/34*    (2006.01)
*G11C 29/00*    (2006.01)

(52) U.S. Cl.
CPC ........ *G06F 12/0246* (2013.01); *G11C 16/349* (2013.01); *G11C 29/00* (2013.01); *G06F 2212/7201* (2013.01)

(58) Field of Classification Search
CPC ......... G06F 12/0246; G06F 2212/7201; G11C 29/00; G11C 16/349; G11C 2029/0411; G11C 29/52
See application file for complete search history.

(56) References Cited

U.S. PATENT DOCUMENTS

| | | | | |
|---|---|---|---|---|
| 5,379,391 A | * | 1/1995 | Belsan | G06F 12/0815 711/114 |
| 2008/0320213 A1 | * | 12/2008 | Kinoshita | G06F 12/0246 711/103 |
| 2015/0039814 A1 | * | 2/2015 | Lim | G06F 12/0246 711/103 |
| 2016/0034206 A1 | * | 2/2016 | Ryan | G11C 16/349 711/103 |
| 2020/0004432 A1 | * | 1/2020 | Sharon | G06F 3/0613 |

FOREIGN PATENT DOCUMENTS

KR    1020150015764    2/2015
KR    101626218    6/2016

* cited by examiner

*Primary Examiner* — Francisco A Grullon
(74) *Attorney, Agent, or Firm* — IP & T Group LLP

(57) ABSTRACT

A memory system includes: a memory device storing data in a location determined by a physical address corresponding to a logical address; and a controller updating the physical address corresponding to the logical address for moving the data associated with the logical address to another location, storing the data including update history of the physical address corresponding to the logical address into the another location determined by the updated physical address, and tracking the data associated with the logical address based on the update history of the physical address when the data is not stored normally into the another location. The data processing system is capable of efficiently storing a plurality of data managed in a tree structure.

8 Claims, 13 Drawing Sheets

| LBA X (691) | Pattern 1 (611) | Pattern 2 (612) | Pattern 3 (613) |
|---|---|---|---|
| Pattern 4 (614) | ... | | |
| | | | |
| | | | |
| | | | |
| | | | |
| | | ... | Pattern 27 (637) |
| Pattern 28 (638) | Pattern 29 (639) | Pattern 30 (640) | LBA X (692) |

| LBA 20 (791) | Pattern 1 (711) | Pattern 2 (712) | Pattern 3 (713) |
|---|---|---|---|
| E/W (714) | Read Count (715) | DBG (716) | Index (717) |
| PBA 1 (731) | PBA 2 (732) | PBA 3 (733) | PBA 4 (734) |
| PBA 5 (735) | PBA 6 (736) | PBA 7 (737) | PBA 8 (738) |
| PBA 9 (739) | PBA 10 (740) | PBA 11 (741) | PBA 12 (742) |
| PBA 13 (743) | PBA 14 (744) | PBA 15 (745) | PBA 16 (746) |
| PBA 17 (747) | PBA 18 (748) | PBA 19 (749) | PBA 20 (750) |
| Pattern 28 (771) | Pattern 29 (772) | Pattern 30 (773) | LBA 20 (792) |

| LBA 19<br>(793) | Pattern 1<br>(711) | Pattern 2<br>(712) | Pattern 3<br>(713) |
|---|---|---|---|
| E/W<br>(714) | Read Count<br>(715) | DBG<br>(716) | Index<br>(717) |
| PBA 1<br>(731) | PBA 2<br>(732) | PBA 3<br>(733) | PBA 4<br>(734) |
| PBA 5<br>(735) | PBA 6<br>(736) | PBA 7<br>(737) | PBA 8<br>(738) |
| PBA 9<br>(739) | PBA 10<br>(740) | PBA 11<br>(741) | PBA 12<br>(742) |
| PBA 13<br>(743) | PBA 14<br>(744) | PBA 15<br>(745) | PBA 16<br>(746) |
| PBA 17<br>(747) | PBA 18<br>(748) | PBA 19<br>(749) | SPARE |
| Pattern 28<br>(771) | Pattern 29<br>(772) | Pattern 30<br>(773) | LBA 19<br>(794) |

DATA PROCESSING SYSTEM AND OPERATING METHOD FOR GENERATING PHYSICAL ADDRESS UPDATE HISTORY

CROSS-REFERENCE TO RELATED APPLICATION(S)

The present application claims priority under 35 U.S.C. § 119(a) to Korean Patent Application No. 10-2018-0006841, filed on Jan. 19, 2018, the disclosure of which is incorporated herein by reference in its entirety.

BACKGROUND

1. Field

Various embodiments of the present invention generally relate to a memory system. Particularly, the embodiments relate to a memory system that manages data stored in the memory system, and an operating method thereof.

2. Description of the Related Art

The computer environment paradigm has been transitioning to ubiquitous computing in which computing systems can be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption since they have no moving parts as compared with a hard disk device. Examples of memory systems having such advantages include universal serial bus (USB) memory devices, memory cards having various interfaces, and solid state drives (SSD).

SUMMARY

Various embodiments of the present invention are directed to a data processing system capable of efficiently storing a plurality of data managed in a tree structure, and an operating method of the data processing system.

In accordance with an embodiment of the present invention, a memory system includes: a memory device suitable for storing data; a history data generator suitable for generating history data having a plurality of physical memory block address data; and a history data analyzer suitable for detecting logical memory block address data in the history data.

The history data generator may generate each of the plurality of physical memory block address data in a form of a linked data structure in the history data.

The history data generator may generate and update index information linked to a first physical memory block address data, of the plurality of physical memory block address data, which is the most recently generated physical memory block address data.

The history data generator may link the logical memory block address data of the history data to the index information in the form of the linked data structure, and update the logical memory block address data of the history data.

The history data may have read count information, debugging information and erase/write count information corresponding to the logical memory block address data.

The history data analyzer may identify the first physical memory block address data through the index information, and identify a second physical memory block address data, of the plurality of physical memory block address data, linked to the first physical memory block address data.

The second physical memory block address data may be linked in the form of the linked data structure to the index information of the history data stored at a second physical memory block address.

The history data analyzer may identify the second physical memory block address data, which is the most recently generated physical memory block address data, through the index information of the history data stored at the second physical memory block address, and identify a third physical memory block address data, of the plurality of physical memory block address data, linked to the second physical memory block address data.

The history data analyzer may check the read count information, the debugging information and the erase/write count information in the history data.

The memory system may further include: a controller suitable for controlling the memory device to store the history data therein.

In accordance with another embodiment of the present invention, an operating method of a memory system including a memory device, the method comprising: generating history data having a plurality of physical memory block address data; and detecting logical memory block address data by analyzing the history data.

Generating the history data may include generating each of the plurality of physical memory block address data in a form of a linked data structure in the history data.

Generating the history data may include generating and updating index information linked to a first physical memory block address data, of the plurality of physical memory block address data, which is the most recently generated physical memory block address data.

Generating the history data may include linking the logical memory block address data of the history data to the index information in the form of the linked data structure, and updating the logical memory block address data of the history data.

The history data may have read count information, debugging information and erase/write count information corresponding to the logical memory block address data.

Detecting logical memory block address data may include identifying the first physical memory block address data through the index information, and identifying a second physical memory block address data linked to the first physical memory block address data.

The second physical memory block address data may be linked in the form of the linked data structure to the index information of the history data stored at a second physical memory block address.

Detecting logical memory block address data may include identifying the second physical memory block address data, which is the most recently generated physical memory block address data, through the index information of the history data stored at the second physical memory block address, and identifying a third physical memory block address data, of the plurality of physical memory block address data, linked to the second physical memory block address data.

Detecting logical memory block address data includes checking may check the read count information, the debugging information and the erase/write count information in the history data.

The operating method of the memory system may further include: controlling the memory device to store the history data therein.

In accordance with an embodiment of the present invention, a memory system includes: a memory device suitable for storing data in a specific location determined by a logical memory address and a physical memory address; and a controller suitable for recognizing the change of the physical memory address, generating a history data regarding the change of the physical address, and updating a map data for linking the logical memory address with the physical memory address based on the history data.

The controller may determine whether the history data includes a fault of the physical memory block address, before updating the map data.

BRIEF DESCRIPTION OF THE DRAWINGS

FIG. 6 is a diagram illustrating a conventional data structure of a sector used in R&D environment or data verification environment.

FIG. 7A is a diagram illustrating a data structure of history data in accordance with an embodiment of the present invention.

FIG. 7B is a diagram illustrating second history data and an operation of a history data analyzer in accordance with an embodiment of the present invention.

DETAILED DESCRIPTION

Figure 1:
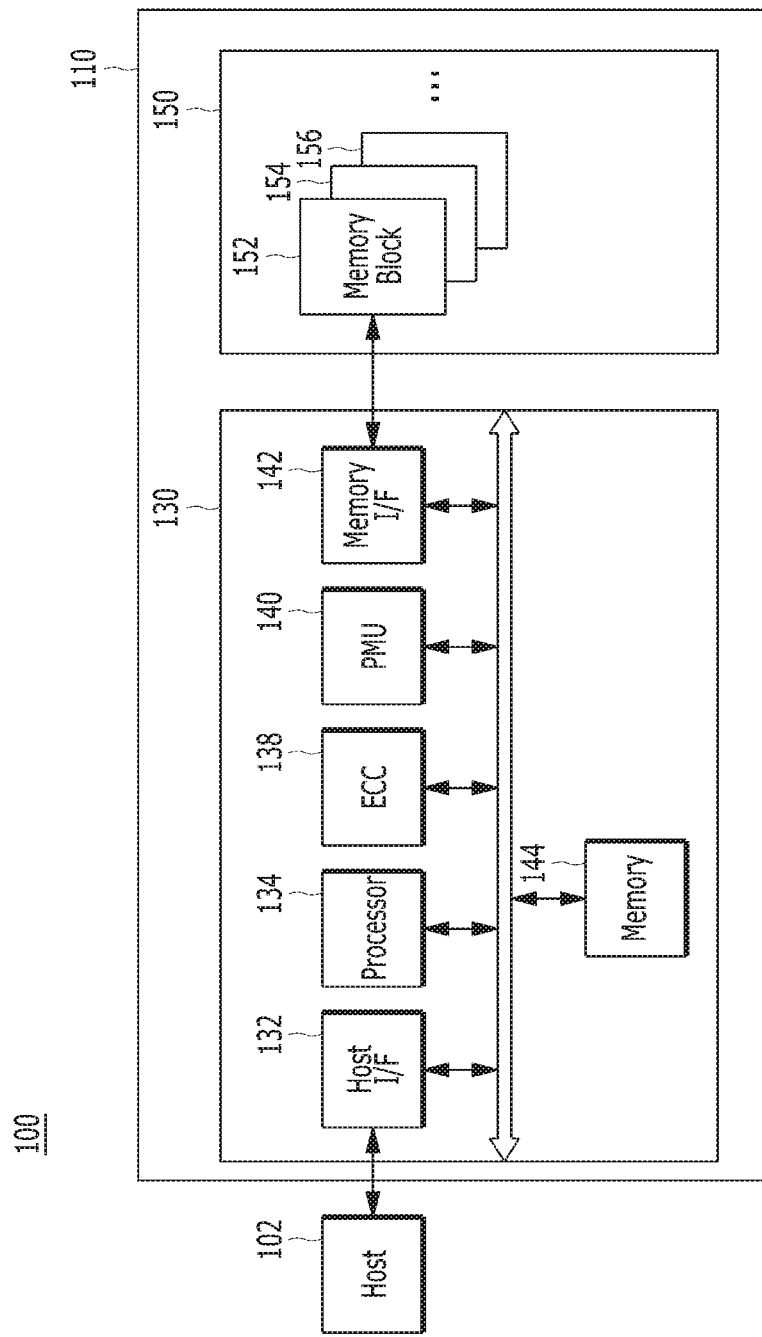
FIG. 1 is a block diagram illustrating a data processing system including a memory system in accordance with an embodiment of the present invention.

Various embodiments of the present invention are described below in more detail with reference to the accompanying drawings. However, the present invention may be embodied in different forms and variations of the disclosed embodiments, and thus are not limited to the embodiments set forth herein. Rather, the described embodiments are provided so that this disclosure is thorough and complete and fully conveys the present invention to those skilled in the art to which this invention pertains. Throughout the disclosure, like reference numerals refer to like parts throughout the various figures and embodiments of the present invention. Also, throughout the specification, reference to "an embodiment" and the like is not necessarily to only one embodiment, and multiple references to "an embodiment" and the like are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element described below could also be termed as a second or third element without departing from the spirit and scope of the present invention.

The drawings are not necessarily to scale and, in some instances, proportions may have been exaggerated to more clearly illustrate various features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for describing particular embodiments and is not intended to limit the present invention. As used herein, singular forms are intended to include the plural forms and vice versa, unless the context clearly indicates otherwise. It will be further understood that the terms "comprises," "comprising," "includes," and "including" when used in this specification, specify the presence of the stated elements but do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention pertains in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Various embodiments of the present invention will be described in detail with reference to the attached drawings.

FIG. 1 is a block diagram illustrating a data processing system 100 including a memory system 110 in accordance with an embodiment of the present invention.

Referring to FIG. 1, the data processing system 100 may include a host 102 operatively coupled to the memory system 110.

The host 102 may include portable electronic devices such as a mobile phone, MP3 player and laptop computer or non-portable electronic devices such as a desktop computer, game machine, TV and projector.

The host 102 may include at least one OS (operating system). The OS may manage and control overall functions and operations of the host 102. The OS may provide or support an operation between the host 102 and the data processing system 100 or the memory system 110. The OS may support functions and operations requested by a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. The host 102 may include a plurality of operating systems. The host 102 may execute an OS to perform an operation corresponding to a user's request on the memory system 110. Here, the host 102 may provide a plurality of commands corresponding to a user's request to the memory system 110. Thus, the memory system 110 may perform certain operations corresponding to the plurality of commands, that is, corresponding to the user's request.

The memory system 110 may operate to store data for the host 102 in response to a request of the host 102. Non-limiting examples of the memory system 110 include a solid state drive (SSD), a multi-media card (MMC), a secure digital (SD) card, a universal storage bus (USB) device, a universal flash storage (UFS) device, a compact flash (CF) card, a smart media card (SMC), a personal computer memory card international association (PCMCIA) card, and a memory stick. The MMC may include an embedded MMC (eMMC), a reduced size MMC (RS-MMC) and a micro-MMC, and the like. The SD card may include a mini-SD card and a micro-SD card.

The memory system 110 may include various types of storage devices. Non-limiting examples of storage devices in the memory system 110 include volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM), and a flash memory.

The memory system 110 may include a memory device 150 and a controller 130. The memory device 150 may store data for the host 102, and the controller 130 may control data storage into the memory device 150.

The controller 130 and the memory device 150 may be integrated into a single semiconductor device, which may be included in any of the various types of memory systems described above. By way of example but not limitation, the controller 130 and the memory device 150 may be integrated as a single semiconductor device to constitute an SSD. When the memory system 110 is used as an SSD, the operating speed of the host 102 connected to the memory system 110 can be improved. In another example, the controller 130 and the memory device 150 may be integrated as a single semiconductor device to constitute a memory card such as a PCMCIA (personal computer memory card international association) card, a CF card, a SMC (smart media card), memory stick, a MMC including a RS-MMC and a micro-MMC, a SD card including a mini-SD, a micro-SD and a SDHC, or a UFS device.

Non-limiting application examples of the memory system 110 include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device that retains stored data even though power is not supplied. The memory device 150 may store data provided from the host 102 through a write operation, and output data stored therein to the host 102 through a read operation. In an embodiment, the memory device 150 may include a plurality of memory dies (not shown). Each memory die may include a plurality of planes (not shown). Each plane may include a plurality of memory blocks 152 to 156, each of which may include a plurality of pages. Each of the pages may include a plurality of memory cells coupled to a word line. In an embodiment, the memory device 150 may be a flash memory having a 3-dimensional (3D) stack structure, which will be described in more detail with reference to FIG. 4 below.

The structure of the memory device 150 and the 3D stack structure of the memory device 150 will be described in detail below with reference to FIGS. 2 to 4. The memory device 150 including a plurality of memory dies, each including a plurality of planes, each including a plurality of memory blocks 152 to 156 will be described in detail below with reference to FIG. 6. Thus, further description on such structure is omitted here.

The controller 130 may control the memory device 150 in response to a request from the host 102. Specifically, the controller may control a read operation, a write operation (also referred to as a program operation) and an erase operation, which are performed in the memory device 150. For example, the controller 130 may provide data read from the memory device 150 to the host 102, and store data provided from the host 102 into the memory device 150.

The controller 130 may include a host interface (I/F) 132, a processor 134, an error correction code (ECC) component 138, a Power Management Unit (PMU) 140, a memory interface 142 such as a NAND flash controller, and a memory 144, all operatively coupled via an internal bus.

The host interface 132 may be configured to process a command and data of the host 102. The host interface 132 may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (DATA), enhanced small disk interface (ESDI) and integrated drive electronics (IDE). The host interface 132 may be driven via a firmware, that is, a host interface layer (HIL) for exchanging data with the host 102.

The ECC component 138 may correct error bits of data to be processed by the memory device 150 and may include an ECC encoder and an ECC decoder. The ECC encoder may perform error correction encoding on data to be programmed into the memory device 150 to generate data to which a parity bit is added. The data including the parity bit may be stored in the memory device 150. The ECC decoder may detect and correct an error contained in the data read from the memory device 150. In other words, the ECC component 138 may perform an error correction decoding process to the data read from the memory device 150 through an ECC code generated during an ECC encoding process. According to a result of the error correction decoding process, the ECC component 138 may output a signal, for example, an error correction success or fail signal. When the number of error bits is more than a threshold value of correctable error bits, the ECC component 138 may not correct the error bits, and may instead output an error correction fail signal. The ECC component 138 may perform error correction through a coded modulation such as a Low Density Parity Check (LDPC) code, a Bose-Chaudhri-Hocquenghem (BCH) code, a turbo code, a Reed-Solomon code, a convolution code, a Recursive Systematic Code (RSC), a Trellis-Coded Modulation (TCM) and a Block coded modulation (BCM). However, the ECC component 138 is not limited to these error correction techniques. As such, the ECC component 138 may include all circuits, modules, systems or devices suitable for error correction.

The PMU 140 may manage electrical power used by the controller 130.

The memory interface 142 may serve as a memory/storage interface for interfacing between the controller 130 and the memory device 150 such that the controller 130 may control the memory device 150 in response to a request from the host 102. When the memory device 150 is a flash memory, specifically a NAND flash memory, the memory interface 142 may be NAND flash controller (NFC) and may generate a control signal for the memory device 150. The memory interface 142 may provide data for the memory device 150 under the control of the processor 134. The memory interface 142 may work as an interface (e.g., a NAND flash interface) for processing a command and data between the controller 130 and the memory device 150. Specifically, the memory interface 142 may support data transfer between the controller 130 and the memory device 150. The memory interface unit 142 may use firmware, that is, a flash interface layer (FIL) for exchanging data with the memory device 150.

The memory 144 may serve as a working memory of the memory system 110 and the controller 130. The memory 144 may store data for driving the memory system 110 and the controller 130. The controller 130 may control the memory device 150 to perform read, write, program, and erase operations in response to a request from the host 102. The controller 130 may provide data read from the memory device 150 to the host 102, and may store data provided from the host 102 into the memory device 150. The memory 144 may store data required for the controller 130 and the memory device 150 to perform these operations.

The memory 144 may be embodied by a volatile memory. By way of example but not limitation, the memory 144 may be embodied as a static random access memory (SRAM) or a dynamic random access memory (DRAM). The memory 144 may be disposed within or externally to the controller 130. FIG. 1 shows the memory 144 disposed within the controller 130. In an embodiment, the memory 144 may be embodied by an external volatile memory having a memory interface transferring data between the memory 144 and the controller 130.

As described above, the memory 144 may include at least one of a program memory, a data memory, a write buffer/cache, a read buffer/cache, a data buffer/cache and a map buffer/cache to store data required to perform data write and read operations between the host 102 and the memory device 150 and other data required for the controller 130 and the memory device 150 to perform these operations.

The processor 134 may control overall operations of the memory system 110. The processor 134 may use firmware to control the overall operations of the memory system 110. The firmware may be referred to as flash translation layer (FTL). Also, the processor 134 may be implemented with a microprocessor or a Central Processing Unit (CPU).

For example, the controller 130 may perform an operation requested by the host 102 in the memory device 150 through the processor 134, which is implemented with a microprocessor, a CPU, or the like. In other words, the controller 130 may perform a command operation corresponding to a command received from the host 102. The controller 130 may perform a foreground operation as the command operation corresponding to the command received from the host 102. For example, the foreground operation may include any of a program operation corresponding to a write command, a read operation corresponding to a read command, an erase operation corresponding to an erase command, and a parameter set operation corresponding to a set parameter command, or a set feature command as a set command.

Also, the controller 130 may perform a background operation on the memory device 150 through the processor 134, which is implemented with a microprocessor or a CPU. The background operation performed on the memory device 150 may include any of an operation of copying and processing data stored in some memory blocks among the memory blocks 152 to 156 of the memory device 150 into other memory blocks, e.g., a garbage collection (GC) operation, an operation of performing swapping between the memory blocks 152 to 156 or between the data of the memory blocks, e.g., a wear-leveling (WL) operation, an operation of storing the map data stored in the controller 130 in the memory blocks 152 to 156, e.g., a map flush operation, or an operation of managing bad blocks of the memory device 150, e.g., a bad block management operation of detecting and processing bad blocks among the memory blocks 152 to 156.

Figure 2:
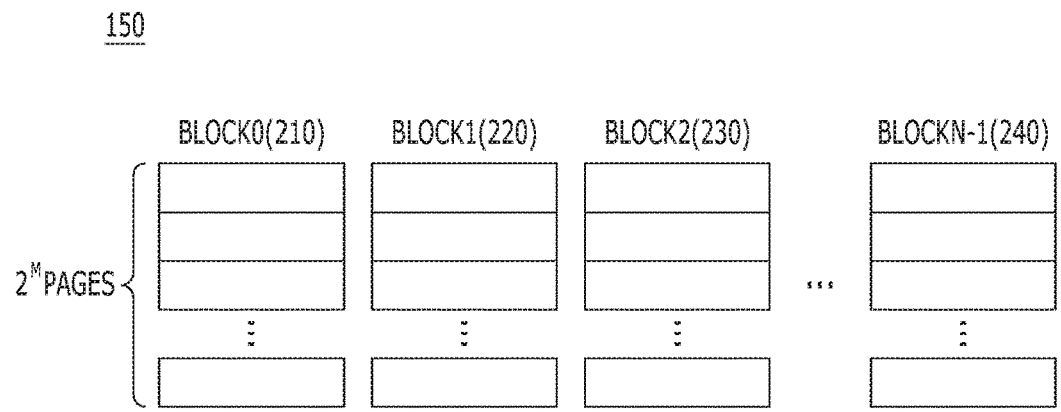
FIG. 2 is a schematic diagram illustrating an exemplary configuration of a memory device employed in the memory system of FIG. 1.

FIG. 2 is a schematic diagram illustrating an exemplary configuration of the memory device 150 employed in the memory system 110 of FIG. 1.

Referring to FIG. 2, the memory device 150 may include a plurality of memory blocks BLOCK0 to BLOCKN−1, where N is an integer greater than 1. Each of the memory blocks BLOCK0 to BLOCKN−1 may include a plurality of pages, for example, $2^M$ pages, the number of which may vary depending on circuit design. Here, M is an integer greater than 1.

Also, memory cells in the respective memory blocks BLOCK0 to BLOCKN−1 may be one or more of a single level cell (SLC) memory block storing 1-bit data or a multi-level cell (MLC) memory block storing 2-bit data. Hence, the memory device 150 may include SLC memory blocks or MLC memory blocks, depending on the number of bits to be expressed or stored in each of the memory cells in the memory blocks. The SLC memory blocks may include a plurality of pages that are embodied by memory cells, each storing one-bit data. The SLC memory blocks may generally have higher data computing performance and higher durability than the MCL memory blocks. The MLC memory blocks may include a plurality of pages which are embodied by memory cells, each storing multi-bit data (for example, 2 or more bits). The MLC memory blocks may generally have a larger data storage space, that is, higher integration density, than the SLC memory block. In another embodiment, the memory device 150 may include a plurality of triple level cell (TLC) memory blocks. In yet another embodiment, the memory device 150 may include a plurality of quadruple level cell (QLC) memory blocks. The TCL memory blocks may include a plurality of pages which are embodied by memory cells, each capable of storing 3-bit data. The QLC memory blocks may include a plurality of pages which are embodied by memory cells, each capable of storing 4-bit data. Although the memory device 150 has been described as a nonvolatile memory, such description is merely exemplary. The memory device 150 may be implemented by any one of a phase change random access memory (PCRAM), a resistive random access memory (RRAM(ReRAM)), a ferroelectrics random access memory (FRAM), and a spin transfer torque magnetic random access memory (STT-RAMS (STT-MRAM)).

Figure 3:
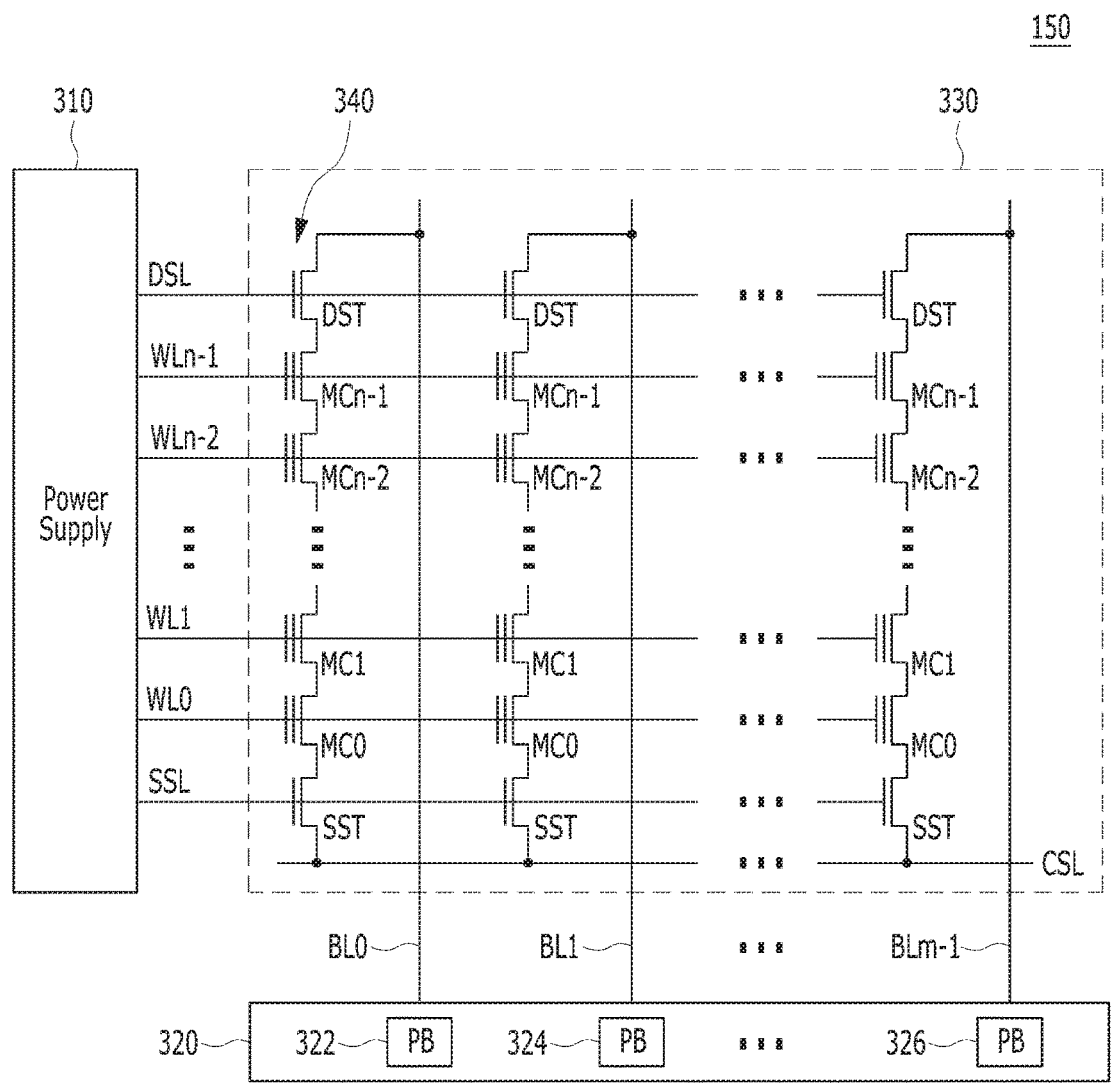
FIG. 3 is a circuit diagram illustrating an exemplary configuration of a memory cell array of a memory block in the memory device shown in FIG. 1.

FIG. 3 is a circuit diagram illustrating an exemplary configuration of a memory cell array of a memory block 330 in the memory device 150. For example, the memory block 330 may correspond to any of the plurality of memory blocks 152 to 156 in the memory device 150 of the memory system 110.

Referring to FIG. 3, the memory block 330 may include a plurality of cell strings 340 coupled to a plurality of corresponding bit lines BL0 to BLm−1. For reference, in FIG. 3, 'DSL' denotes a drain select line, 'SSL' denotes a source select line, and 'CSL' denotes a common source line. Each of the cell strings 340 may be electrically coupled to a bit line BL, at least one source select line SSL, at least one ground select line GSL, a plurality of word lines WL, at least one dummy word line DWL, and a common source line CSL. The cell string 340 of each column may include one or more drain select transistors DST and one or more source select transistors SST. Between the drain and source select transistors DST, SST, a plurality of memory cells MC0 to MCn−1 may be coupled in series. In an embodiment, each of the memory cell transistors MC0 to MCn−1 may be implemented by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the present disclosure is not limited thereto. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which generates different word line voltages including a program voltage, a read voltage, and a pass voltage to supply to the word lines according to an operation mode. The voltage generation operation of the voltage supply 310 may be controlled by a control circuit (not illustrated). Under the control of the control circuit, the voltage supply 310 may select at least one of the memory blocks (or sectors) of the memory cell array, select at least one of the word lines of the selected memory block, and provide the word line voltages to the selected word line(s) and the unselected word line(s) as may be needed.

The memory device 150 may include a read/write circuit 320 which is controlled by the control circuit. During a verification/normal read operation, the read/write circuit 320 may operate as a sense amplifier for reading (sensing and amplifying) data from the memory cell array. During a program operation, the read/write circuit 320 may operate as a write driver for supplying a voltage or a current to bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs). Each of the page buffers 322 to 326 may include a plurality of latches (not illustrated).

Figure 4:
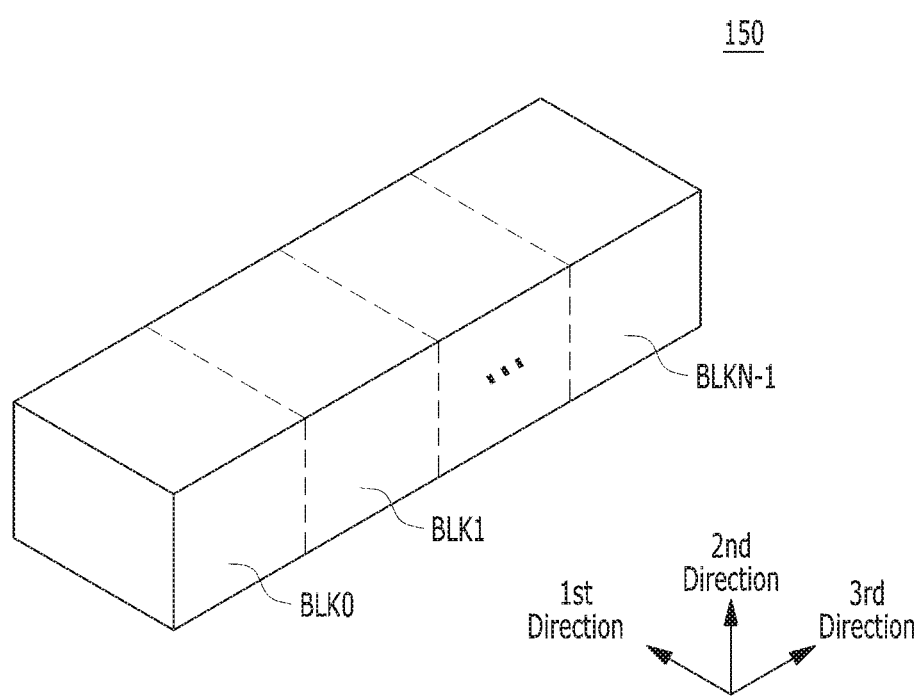
FIG. 4 is a block diagram illustrating an exemplary three-dimensional structure of the memory device shown in FIG. 2.

FIG. 4 is a schematic diagram illustrating an exemplary 3D structure of the memory device 150.

The memory device 150 may be embodied by a 2D or 3D memory device. FIG. 4 illustrates the memory device 150 embodied as a nonvolatile memory device having a 3D stack structure. When the memory device 150 has a 3D structure, the memory device 150 may include a plurality of memory blocks BLK0 to BLKN−1 each having a 3D structure (or vertical structure).

A data processing operation for a memory device in a memory system, particularly, a data processing operation performed when a plurality of command operations corresponding to a plurality of commands received from the host 102 are performed, in accordance with an embodiment of the present invention, will be described in detail with reference to FIGS. 5 to 8.

Figure 5:
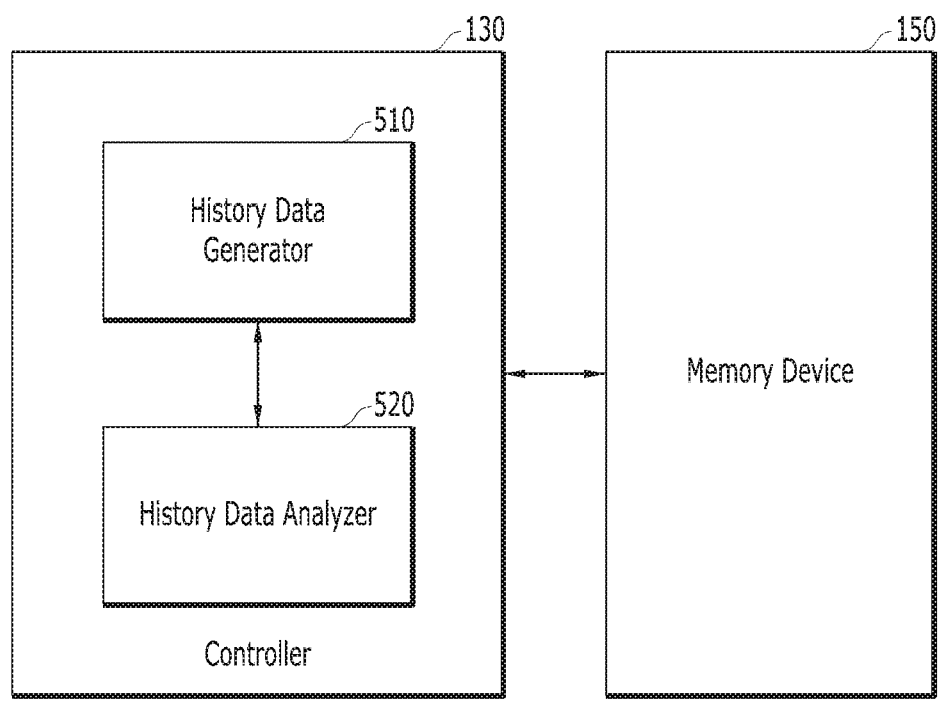
FIG. 5 is a diagram illustrating a memory system capable of generating and analyzing history data in accordance with an embodiment of the present invention.

FIG. 5 is a diagram illustrating a memory system capable of generating and analyzing history data in accordance with an embodiment of the present invention.

A history data generator 510 may generate history data including a logical memory block address and a physical memory block address.

The controller 130 may control the memory device 150 to store the history data therein.

A history data analyzer 520 may detect a logical memory block address by analyzing the history data.

The history data generator 510 and the history data analyzer 520 may be provided within the controller 130, as shown in FIG. 5. However, that is merely an example. One or both of the history data generator 510 and the history data analyzer 520 may be provided external to the controller 130.

The history data generator 510 may generate the history data by units of sectors. For example, a size of a single sector may be 512 Bytes in case of the eMMC, and may be 4 Kbytes in case of the UFS.

The history data may be used in R&D environment or data verification environment.

FIG. 6 is a diagram illustrating a data structure of a sector 600 used in R&D environment or data verification environment of a conventional memory system.

The sector 600 includes logical memory block address data 691 and 692 and data patterns 611 to 640.

The logical memory block address data 691 and 692 may be the same as each other.

The data pattern 611 to 640 is verification data used for determining whether the sector 600 is operating properly. That is, the controller 130 may determine whether the data patterns 611 to 640 are properly programmed through a debugging operation.

The data patterns 611 to 640 may be stored into a storage area, which is a user data storage area not in the R&D environment or data verification environment but in a real-world usage environment.

During a garbage collection operation in the R&D environment or data verification environment, the physical memory block address representing the sector 600 is changed.

When the previous physical memory block address before the change of the physical memory block address representing the sector 600 is not managed, it is difficult to detect the logical memory block address corresponding to the previous memory block address representing the sector 600.

Therefore, to solve such problem of the prior art, in accordance with an embodiment of the present invention, the history data generator 510 may control the memory device 150 to store a physical memory block address as the history data therein whenever the physical memory block address is changed due to a garbage collection operation, a sudden power off (SPO), and the like.

The history data generator 510 may generate and update the history data in a form of a data structure such that the physical memory block address can be tracked.

FIG. 7A is a diagram illustrating a data structure of the history data 700 in accordance with an embodiment of the present invention.

The history data 700 may have logical memory block address data 791 and 792, data patterns 711 to 713 and 771 to 773, erase/write count information 714, read count information 715, debugging information 716, index information 717 and physical memory block address data 731 to 750.

A first physical memory block address data 731 may be the physical memory block address data first generated by the history data generator 510 in the history data 700.

A second physical memory block address data 732 may be generated in the history data 700, subsequently to the first physical memory block address data 731, by the history data generator 510.

The second physical memory block address data 732 may be changed from the first physical memory block address data 731, due to a garbage collection operation, a sudden power off (SPO) and the like, after the first physical memory block address data 731 is generated. The second physical memory block address data 732 may be the latest physical memory block address data after a garbage collection operation, a sudden power off (SPO), and the like.

The history data generator 510 may generate the second physical memory block address data 732 in a form of a linked data structure, which is linked to the first physical memory block address data 731.

Therefore, as illustrated in FIG. 7A, the history data 700 includes twenty (20) physical memory block address data 731 to 750, which represents that the first physical memory block address data 731 has changed nineteen (19) times after the generation of such data 731.

Referring to FIG. 7A, among the physical block address data 731 to 750, the twentieth physical memory block address data 750 may be the latest physical memory block address data, and the nineteenth physical memory block address data 750 may be the one generated right or immediately before the twentieth physical memory block address data 750 (i.e., the latest physical memory block address data).

As described above, the history data generator 510 may generate each of the physical memory block address data 731 to 750 of the history data 700 in the form of the linked data structure.

The history data generator 510 may generate and update the index information 717, which is linked to the most recently generated physical memory block address data (e.g., the twentieth physical memory block address data 750) in the form of the linked data structure.

In detail, the history data generator 510 may link the index information 717 to the first physical memory block address data 731, which is the first generated physical memory address data, in the form of the linked data structure by first generating the first physical memory block address data 731 and then generating the index information 717.

Then, when the history data generator 510 generates the second physical memory block address data 732 after the first physical memory block address data 731 is generated, the history data generator 510 may link the index information 717 to the second physical memory block address data 732, which is the most recently generated physical memory address data, in the form of the linked data structure.

That is, the history data generator 510 may update the index information 717 such that the index information 717 is linked to the most recently generated physical memory block address data in the form of the linked data structure.

Therefore, as illustrated in FIG. 7A, the history data 700 has the twentieth physical memory block address data 750 as the most recently generated physical memory block address data. The index information 717 may be linked to the twentieth physical memory block address data 750 as the most recently generated physical memory block address data in the form of the linked data structure.

The history data generator 510 may link the logical memory block address data 791, 792 to the index information 717 in the form of the linked data structure. The history data generator 510 may update the logical memory block address data 791 and 792.

FIG. 7A illustrates the history data 700 having two (2) logical memory block address data 791, 792, which is merely an example. In an embodiment, the history data 700 may have a single logical memory block address data.

FIG. 7A illustrates a single logical memory block address data 792 linked to the index information 717. In an embodiment, all of the logical memory block address data 791, 792 may be linked to the index information 717. In the following description, it is assumed that the history data 700 has two (2) logical memory block address data 791, 792, and, among those two, a twentieth logical memory block address data 792 is linked to the index information 717.

In detail, the history data generator 510 may link the index information 717 to a first logical memory block address data, which is the first generated logical memory block address data in the history data 700, in the form of the linked data structure.

After the generation of the first logical memory block address, when the first logical memory block address is changed to a second logical memory block address due to a garbage collection operation, a sudden power off (SPO) and the like, the history data generator 510 may update the first logical memory block address to the second logical memory block address. The history data generator 510 may link the second logical memory block address to the index information 717 in the form of the linked data structure.

Also, the history data generator 510 may generate other history data to generate new history data before change of the first logical memory block address to the second logical memory block address.

The other history data or the new history data may have the first physical memory block address data and the first logical memory block address data but may not have the second physical memory block address data or the second logical memory block address data.

The new history data may have the erase/write count information 714, the read count information 715 and the debugging information 716, which are information right before the change of the first logical memory block address data to the second logical memory block address data.

The history data analyzer 520 may detect the first physical memory block address data linked to the second physical memory block address data by using the index information 717.

The history data analyzer 520 may identify new history data having the first physical memory block address data through the first physical memory block address data.

According to this, the history data analyzer 520 may identify the erase/write count information 714, the read count information 715 and the debugging information 716 in the new history data.

For example, the history data analyzer 520 may recognize or identify the twentieth physical memory block address data 750, which is the most recently generated physical memory block address, and the twentieth logical memory block address data 792 through the index information 717 in the first history data 700.

The history data analyzer 520 may recognize or identify the erase/write count information 714, the read count information 715 and the debugging information 716 in the first history data 700.

The history data analyzer 520 may recognize or identify detailed information of the first history data 700 through the erase/write count information 714, the read count information 715 and the debugging information 716 in the first history data 700.

When there is no fault in the first history data 700, the history data analyzer 520 may identify the nineteenth physical memory block address based on the twentieth physical memory block address data 750.

The history data analyzer 520 may identify second history data stored in the nineteenth physical memory block address data 749 based on the nineteenth physical memory block address data 749.

FIG. 7B is a diagram illustrating the second history data 705 and an operation of the history data analyzer 520 in accordance with an embodiment of the present invention.

The second history data 705 may be the one right before the nineteenth logical memory block address data LBA 19 794 is changed to the twentieth logical memory block address data LBA 20 792, as described with reference to FIG. 7A.

Therefore, the second history data 705 may have the nineteenth physical memory block address data 749, not the twentieth physical memory block address data 750, as the most recently generated physical memory block address data.

The history data analyzer 520 may identify the erase/write count information 714, the read count information 715 and the debugging information 716 of the second history data 705, which are stored at the nineteenth physical memory block address.

The history data analyzer 520 may identify detailed information that the second history data 705 has through the erase/write count information 714, the read count information 715 and the debugging information 716 in the second history data 705.

When there is no fault in the second history data 705, the history data analyzer 520 may identify the eighteenth physical memory block address data 748 based on the nineteenth physical memory block address data 749.

The history data analyzer 520 may identify third history data stored in the eighteenth physical memory block address based on the nineteenth physical memory block address data 749.

Figure 8:
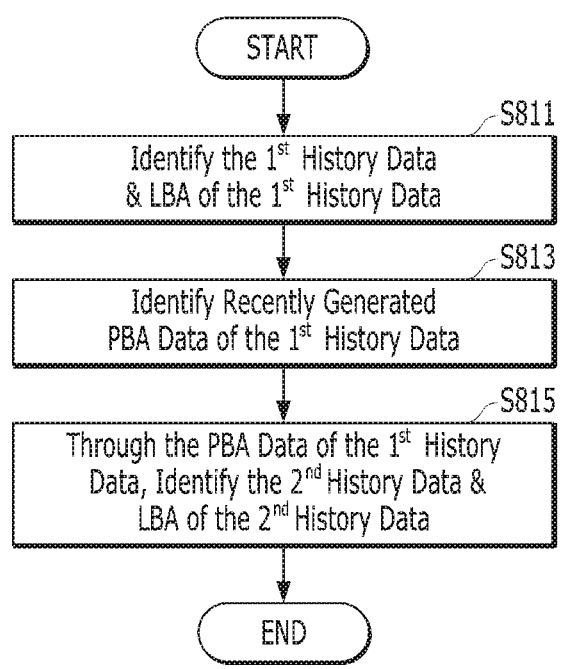
FIG. 8 is a flowchart illustrating an operation of a history data analyzer in accordance with an embodiment of the present invention.

FIG. 8 is a flowchart illustrating an operation of the history data analyzer 520 in accordance with an embodiment of the present invention.

At step S811, the history data analyzer 520 may identify the first history data 700 and a logical memory block address data in the first history data 700.

In detail, the history data analyzer 520 may identify the erase/write count information 714, the read count information 715 and the debugging information 716 in the first history data 700.

Through the identification, when there is any fault in the first history data 700 (e.g., when there is any fault in the first history data 700 during the debugging operation), the history data analyzer 520 may identify the logical memory block address data (e.g., the first and second logical memory block address data 791 and 792) of the first history data 700.

Through the logical memory block address data (e.g., the first and second logical memory block address data 791 and 792) of the first history data 700, data related to the fault may be identified so that such data may be used for solving the fault.

When there is no fault in the first history data 700, the history data analyzer 520 may identify the most recently generated physical memory block address data in the first history data 700 at step S813.

At step S815, the history data analyzer 520 may identify the physical memory block address data linked to the most recently generated physical memory block address data in the first history data 700 through the most recently generated physical memory block address data in the first history data 700.

Through step S815, the history data analyzer 520 may identify the second history data 705.

The history data analyzer 520 may identify the second history data 705 and a logical memory block address data in the second history data 705.

In detail, the history data analyzer 520 may identify the erase/write count information 714, the read count information 715 and the debugging information 716 in the second history data 705.

Through the identification, when there is any fault in the second history data 705 (e.g., when there is any fault in the second history data 705 during the debugging operation), the history data analyzer 520 may identify the logical memory block address data (e.g., the first and second logical memory block address data 791 and 792) of the second history data 705.

Through the logical memory block address data (e.g., the first and second logical memory block address data 791 and 792) of the second history data 705, data related to the fault may be identified so that such data may be used for solving the fault.

The first history data 700 and the second history data 705 described in connection with FIG. 8 may be merely a part of the operation of the history data analyzer 520. In an embodiment, the history data analyzer 520 may repeat the operation until the history data analyzer 520 identifies a logical memory block address targeted thereby.

FIGS. 9 to 17 are diagrams schematically illustrating exemplary applications of the data processing system of FIGS. 1 to 8 according to various embodiments.

Figure 9:
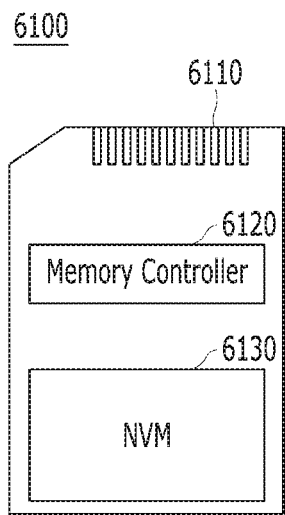
FIGS. 9 to 17 are diagrams schematically illustrating exemplary applications of the data processing system in accordance with various embodiments of the present invention.

FIG. 9 is a diagram schematically illustrating an example of the data processing system including the memory system in accordance with an embodiment. FIG. 9 schematically illustrates a memory card system to which the memory system may be applied.

Referring to FIG. 9, the memory card system 6100 may include a memory controller 6120, a memory device 6130 and a connector 6110.

More specifically, the memory controller 6120 may be electrically connected to, and configured to access, the memory device 6130 embodied as a nonvolatile memory. For example, the memory controller 6120 may be configured to control read, write, erase and background operations of the memory device 6130. The memory controller 6120 may be configured to provide an interface between the memory device 6130 and a host, and to use firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

Thus, the memory controller 6120 may include a RAM, a processor, a host interface, a memory interface and an error correction component. The memory controller 130 may further include the elements described in FIG. 1.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with an embodiment may be applied to wired/wireless electronic devices, particularly mobile electronic devices.

The memory device 6130 may be implemented with a nonvolatile memory. For example, the memory device 6130 may be implemented with any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device to form a solid state driver (SSD). Also, the memory controller 6120 and the memory device 6130 may be formed as a memory card such as a PC card (PCMCIA: Personal Computer Memory Card International Association), a compact flash (CF) card, a smart media card (e.g., a SM and a SMC), a memory stick, a multimedia card (e.g., a MMC, a RS-MMC, a MMCmicro and an eMMC), an SD card (e.g., a SD, a miniSD, a microSD and a SDHC), and/or a universal flash storage (UFS).

Figure 10:
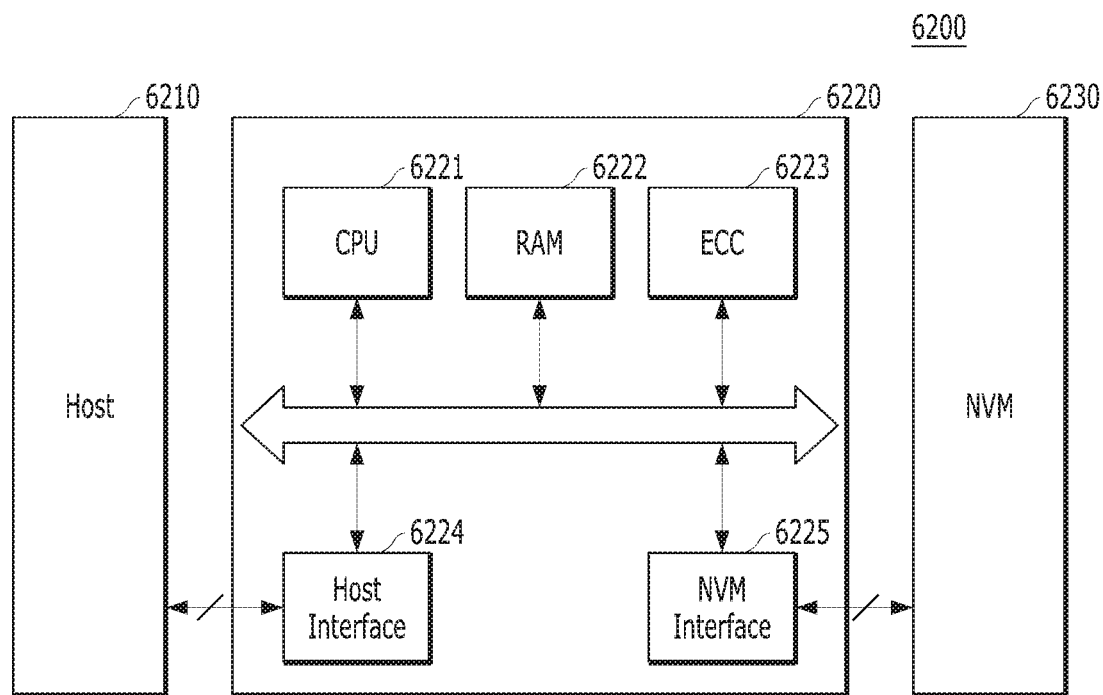

FIG. 10 is a diagram schematically illustrating another example of the data processing system including a memory system in accordance with an embodiment.

Referring to FIG. 10, the data processing system 6200 may include a memory device 6230 having one or more nonvolatile memories and a memory controller 6220 for controlling the memory device 6230. The data processing system 6200 illustrated in FIG. 10 may serve as a storage medium such as a memory card (a CF, a SD, a micro-SD or the like) or USB device, as described with reference to FIG. 1. The memory device 6230 may correspond to the memory device 150 in the memory system 110 described in FIG. 1. The memory controller 6220 may correspond to the controller 130 in the memory system 110 described in FIG. 1.

The memory controller 6220 may control a read, write or erase operation on the memory device 6230 in response to a request of the host 6210. The memory controller 6220 may include one or more CPUs 6221, a buffer memory such as RAM 6222, an ECC circuit 6223, a host interface 6224 and a memory interface such as an NVM interface 6225.

The CPU 6221 may control the operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or vice versa. When the RAM 6222 is used as a cache memory, the RAM 6222 may assist the low-speed memory device 6230 to operate at high speed.

The ECC circuit 6223 may correspond to the ECC component 138 of the controller 130 illustrated in FIG. 1. As described with reference to FIG. 1, the ECC circuit 6223 may generate an ECC (Error Correction Code) for correcting a failed bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224. The memory controller 6220 may transmit/receive data to/from the memory device 6230 through the NVM interface 6225. The host interface 6224 may be connected to the host 6210 via a PATA bus, a SATA bus, a SCSI, a USB, a PCIe or a NAND interface. The memory controller 6220 may perform a wireless communication function with a mobile communication protocol such as WiFi or Long Term Evolution (LTE). The memory controller 6220 may be connected to an external device, for example, the host 6210 or another external device, and then transmit/receive data to/from the external device. As the memory controller 6220 is configured to communicate with the external device through one or more of various communication protocols, the memory system and the data processing system in accordance with an embodiment may be applied to wired/wireless electronic devices, particularly a mobile electronic device.

Figure 11:
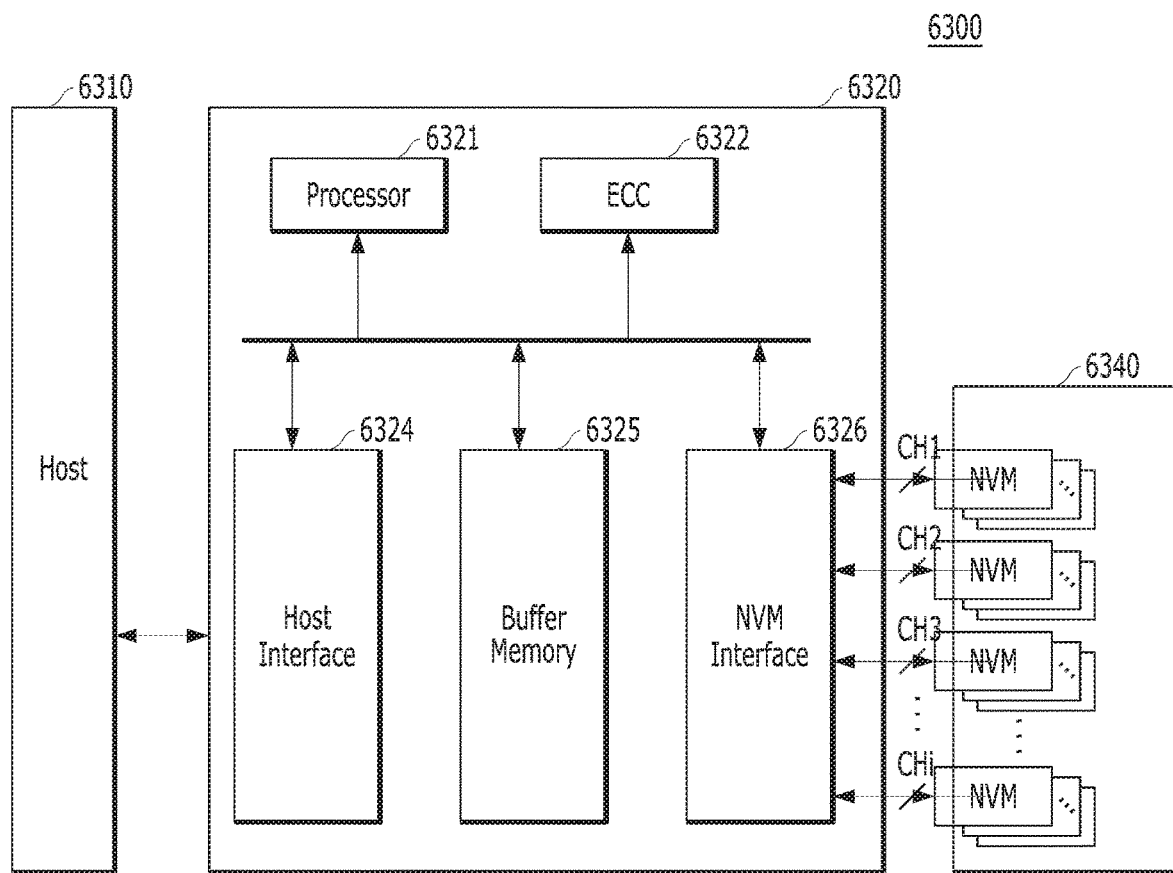

FIG. 11 is a diagram schematically illustrating another example of the data processing system including the memory system in accordance with an embodiment. FIG. 11 schematically illustrates an SSD to which the memory system may be applied.

Referring to FIG. 11, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM in the memory device 6340. The buffer memory 6325 may temporarily store meta data of the plurality of flash memories NVM, for example, map data including a mapping table. The buffer memory 6325 may be embodied as any of a variety of volatile memories such as a DRAM, a SDRAM, a DDR SDRAM, a LPDDR SDRAM and a GRAM or nonvolatile memories such as a FRAM, a ReRAM, a STT-MRAM and a PRAM. FIG. 11 illustrates that the buffer memory 6325 is embodied in the controller 6320. However, the buffer memory 6325 may be external to the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, RAID (Redundant Array of Independent Disks) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, to output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, to output data read from the selected SSDs 6300 to the host 6310.

Figure 12:
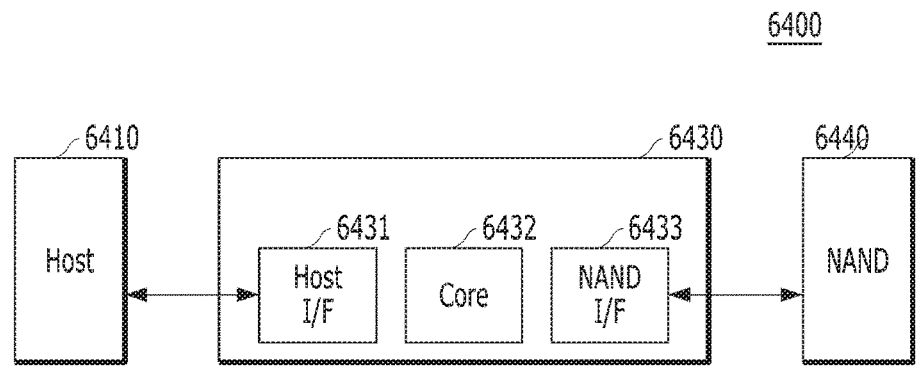

FIG. 12 is a diagram schematically illustrating another example of the data processing system including the memory system in accordance with an embodiment. FIG. 12 schematically illustrates an embedded Multi-Media Card (eMMC) to which the memory system may be applied.

Referring to FIG. 12, the eMMC 6400 may include a controller 6430 and a memory device 6440 embodied as one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control the operations of the eMMC 6400, the host interface 6431 may provide an interface function between the controller 6430 and the host 6410. The NAND interface 6433 may provide an interface function between the memory device 6440 and the controller 6430. For example, the host interface 6431 may serve as a parallel interface such as an MMC interface as described with reference to FIG. 1. Furthermore, the host interface 6431 may serve as a serial interface, for example, UHS ((Ultra High Speed)-I/UHS-II) interface.

FIGS. 13 to 16 are diagrams schematically illustrating other examples of the data processing system including the memory system in accordance with embodiments. FIGS. 13 to 16 schematically illustrate UFS (Universal Flash Storage) systems to which the memory system may be applied.

Referring to FIGS. 13 to 16, the UFS systems 6500, 6600, 6700, 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired/wireless electronic devices, particularly mobile electronic devices. The UFS devices 6520, 6620, 6720, 6820 may serve as embedded UFS devices, and the UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700, 6800 may communicate with external devices, for example, wired/wireless electronic devices, particularly mobile electronic devices, according to any of a UFS protocols. The UFS devices 6520, 6620, 6720, 6820 and the UFS cards 6530, 6630, 6730, 6830 may be embodied as the memory system 110 illustrated in FIG. 1. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 10 to 12, and the UFS cards 6530, 6630, 6730, 6830 may be embodied in the form of the memory card system 6100 described with reference to FIG. 9.

Furthermore, in the UFS systems 6500, 6600, 6700, 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface).

Furthermore, the UFS devices 6520, 6620, 6720, 6820 and the UFS cards 6530, 6630, 6730, 6830 may communicate with each other according to any of various protocols other than a UFS protocol, including protocols applicable to UFDs, MMC, SD, mini-SD, and micro-SD.

Figure 13:
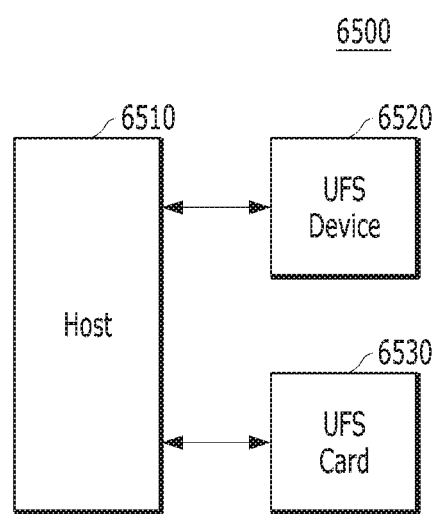

In the UFS system 6500 illustrated in FIG. 13, each of the host 6510, the UFS device 6520 and the UFS card 6530 may include UniPro. The host 6510 may perform a switching operation to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In the illustrated embodiment, one UFS device 6520 and one UFS card 6530 are connected to the host 6510. However, a plurality of UFS devices and UFS cards may be connected in parallel or in the form of a star to the host 6410. A star is an arrangement in which a single device is coupled with multiple devices for centralized operation. A plurality of UFS cards may be connected in parallel or in the form of a star to the UFS device 6520 or connected in series or in the form of a chain to the UFS device 6520.

Figure 14:
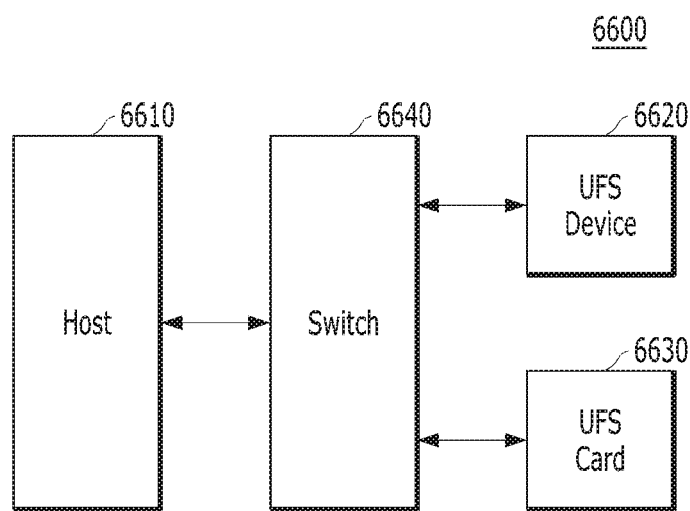

In the UFS system 6600 illustrated in FIG. 14, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the illustrated embodiment, one UFS device 6620 and one UFS card 6630 are connected to the switching module 6640. However, a plurality of UFS devices and UFS cards may be connected in parallel or in the form of a star to the switching module 6640. A plurality of UFS cards may be connected in series or in the form of a chain to the UFS device 6620.

Figure 15:
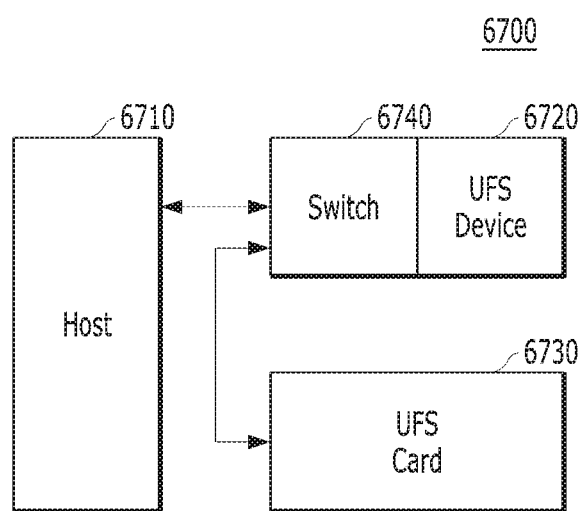

In the UFS system 6700 illustrated in FIG. 15, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro. The switching module 6740 may be integrated as one module with the UFS device 6720 inside or outside the UFS device 6720. In the illustrated embodiment, one UFS device 6720 and one UFS card 6730 are connected to the switching module 6740. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 16:
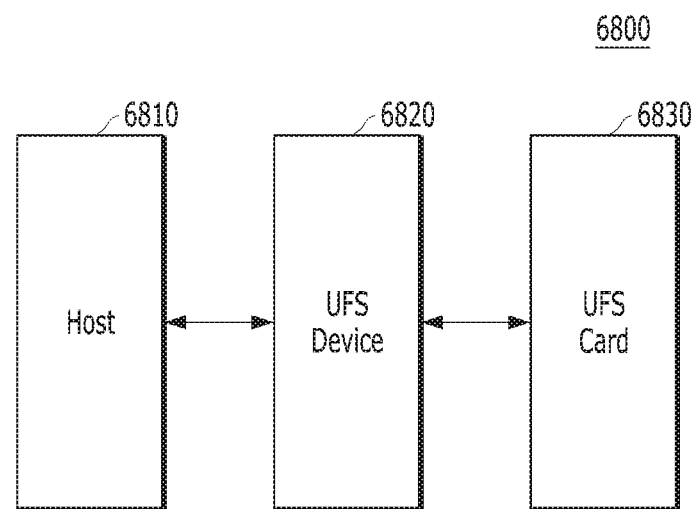

In the UFS system 6800 illustrated in FIG. 16, each of the host 6810, the UFS device 6820 and the UFS card 6830 may include M-PHY and UniPro. The UFS device 6820 may perform a switching operation to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. The host 6810 and the UFS card 6830 may communicate with each other through target ID switching between the M-PHY and UniPro modules of the UFS device 6820. In the illustrated embodiment, one UFS device 6820 is connected to the host 6810 and one UFS card 6830 is connected to the UFS device 6820. However, a plurality of UFS devices may be connected in parallel or in the form of a star to the host 6810, or connected in series or in the form of a chain to the host 6810. A plurality of UFS cards may be connected in parallel or in the form of a star to the UFS device 6820, or connected in series or in the form of a chain to the UFS device 6820.

Figure 17:
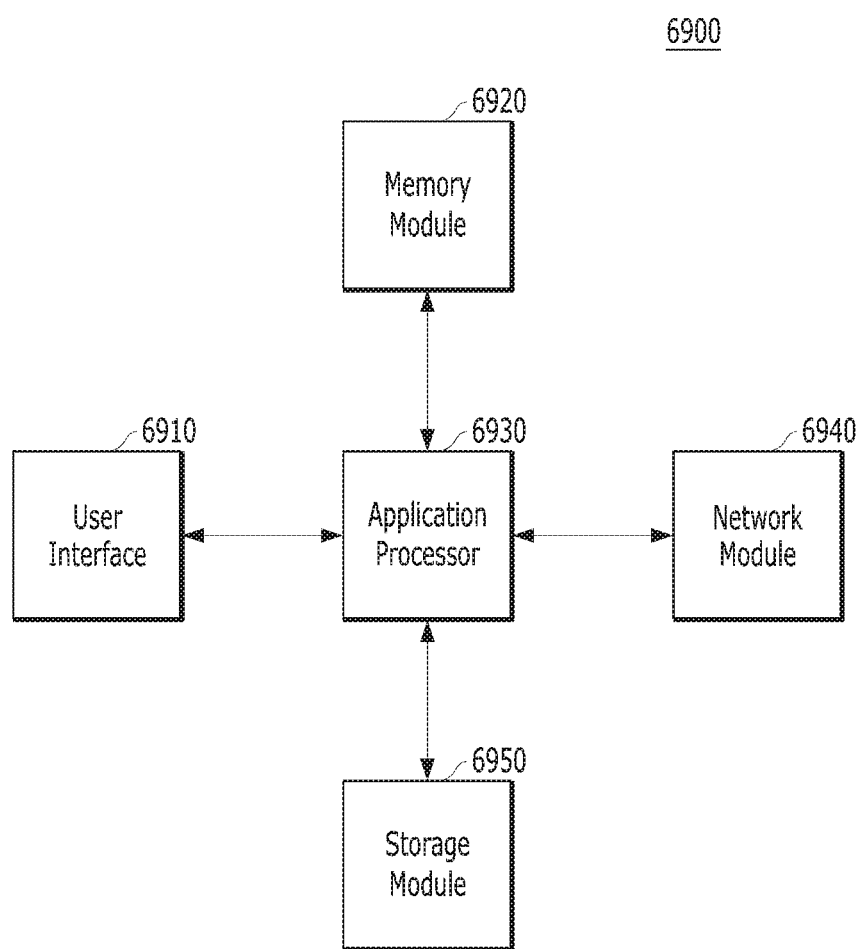

FIG. 17 is a diagram schematically illustrating another example of the data processing system including the memory system in accordance with an embodiment. FIG. 17 is a diagram schematically illustrating a user system to which the memory system may be applied.

Referring to FIG. 17, the user system 6900 may include an application processor 6930, a memory module 6920, a network module 6940, a storage module 6950 and a user interface 6910.

More specifically, the application processor 6930 may drive components in the user system 6900, for example, an OS, and include controllers, interfaces and a graphic engine which control the components in the user system 6900. The application processor 6930 may be provided as a System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but may also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices, particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, a NOR flash and a 3D NAND flash, and provided as a removable storage medium such as a memory card or external drive of the user system

6900. The storage module 6950 may correspond to the memory system 110 described with reference to FIG. 1. Furthermore, the storage module 6950 may be embodied as an SSD, an eMMC and an UFS as described above with reference to FIGS. 11 to 16.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control the operations of the mobile electronic device, and the network module 6940 may serve as a communication module for controlling wired/wireless communication with an external device. The user interface 6910 may display data processed by the processor 6930 on a display/touch module of the mobile electronic device. The user interface 6910 may support a function of receiving data from the touch panel.

While the present invention has been described with respect to specific embodiments, it will be apparent to those skilled in the art in light of this disclosure that various changes and modifications may be made without departing from the spirit and scope of the invention as defined in the following claims.

What is claimed is:

1. A memory system comprising:
 a memory device configured to store data in a location determined by a physical address corresponding to a logical address; and
 a controller configured to update the physical address corresponding to the logical address for moving the data associated with the logical address to another location, store the data including update history of the physical address corresponding to the logical address into the another location determined by the updated physical address, and track the data associated with the logical address based on the update history of the physical address.

2. The memory system of claim 1, wherein the update history of the physical address corresponding to the logical address includes the updated physical address and previously updated physical addresses linked in updated order.

3. The memory system of claim 2, wherein the data further includes at least one of read count information, debugging information and erase/write count information corresponding to the logical memory block address data.

4. The memory system of claim 3, wherein the controller further checks the read count information, the debugging information and the erase/write count information in the history data.

5. An operating method of a memory system including a memory device storing data in a location determined by a physical address corresponding to a logical address, the method comprising:
 updating the physical address corresponding to the logical address for moving the data associated with the logical address to another location;
 storing the data including update history of the physical address corresponding to the logical address into the another location determined by the updated physical address; and
 tracking the data associated with the logical address based on the update history of the physical address.

6. The method of claim 5, wherein the update history of the physical address corresponding to the logical address includes the updated physical address and previously updated physical addresses linked in updated order.

7. The method of claim 6, wherein the data further includes at least one of read count information, debugging information and erase/write count information.

8. The method of claim 7, wherein the method further comprising:
 checking the read count information, the debugging information and the erase/write count information in the data.

\* \* \* \* \*